United States Patent

Heller et al.

[11] Patent Number: 4,463,636
[45] Date of Patent: Aug. 7, 1984

[54] HOLDING FIXTURE AND TRIMMER FOR PC BOARDS

[75] Inventors: Martin G. Heller, 68 Harvey Dr., Short Hills, N.J. 07078; Edward Pecha, Fair Lawn, N.J.; Douglas Smith, Pompton Lakes, N.J.; Joel Rudder, Rockaway, N.J.

[73] Assignee: Martin G. Heller, Short Hills, N.J.

[21] Appl. No.: 352,111

[22] Filed: Feb. 25, 1982

[51] Int. Cl.³ ............................................. B26D 1/00
[52] U.S. Cl. ......................................... 83/13; 83/399; 83/409.2; 83/412; 83/418; 83/422; 83/435.1; 83/445; 83/478; 83/925 R; 83/DIG. 1; 192/131 R; 269/73; 269/221; 269/254 CS
[58] Field of Search ................... 83/925 R, 409, 409.2, 83/412, 413, 414, 415, 437, 13, 59, 399, 418, 422, 435.1, 445, 478, DIG. 1; 192/131 R, 133; 269/254 CS, 236, 221, 228, 73, 20, 21

[56] References Cited

U.S. PATENT DOCUMENTS

| | | | |
|---|---|---|---|
| 2,668,384 | 2/1954 | Barner | 269/21 |
| 3,229,953 | 1/1966 | Muir, Jr. | 269/21 |
| 3,453,918 | 7/1969 | Sharp | 83/925 R |
| 3,815,456 | 6/1974 | Braathen et al. | 192/131 R |
| 4,007,379 | 2/1977 | Whittaker | 192/131 R |
| 4,030,717 | 6/1977 | Serlovsky | 269/118 |
| 4,037,830 | 6/1977 | Poluzzi et al. | 269/21 |
| 4,058,885 | 11/1977 | Bergman | 269/20 |
| 4,078,302 | 3/1978 | Fok et al. | 269/20 |
| 4,143,868 | 3/1979 | Bergman | 269/20 |
| 4,184,472 | 1/1980 | Benedicto et al. | 83/820 |
| 4,187,715 | 2/1980 | Barnacle | 83/458 |
| 4,200,018 | 4/1980 | Sekiwa | 83/437 |
| 4,205,239 | 5/1980 | Arts et al. | 192/131 R |
| 4,401,003 | 8/1983 | Baldwin et al. | 83/483 |

Primary Examiner—Frank T. Yost
Assistant Examiner—Hien H. Phan
Attorney, Agent, or Firm—Ralph R. Roberts

[57] ABSTRACT

The trimming apparatus and fixture for holding a PC board prior to and during trimming of an upper surface of the PC board utilizes a trimming blade rotated by a variable speed motor. This apparatus includes X and Y motion mechanism moved by hand grips that are spaced apart and cooperate with push button switches providing a safety control circuit. The X and Y motion mechanism employs linear ball bushings mounted and movable on hardened steel shafts. Removable holding fixtures are employed to hold and retain the PC boards during trimming. One holding fixture is used for PC boards that are not warped and not likely to warp. This fixture holds the PC board on three sides and a quick acting cam clamp is actuated to retain and release a PC board. Another fixture is adapted to hold and retain a PC board that is warped or likely to warp. Vacuum is used with a plurality of standoffs to establish the desired holding plane of this PC board. A quick opening aperture is uncovered to release both negative pressure and the PC board after trimming. A third fixture employs a top plate which is positioned by dowells. On this fixture and in this plate is formed a plurality of receiving openings for PC boards of small and/or irregular size. Vacuum is also employed as well as standoffs. The interior chamber of this fixture is provided with a quick opening lever plate that is manipulated to uncover an aperture and bring the interior of the fixture to atmospheric pressure.

40 Claims, 15 Drawing Figures

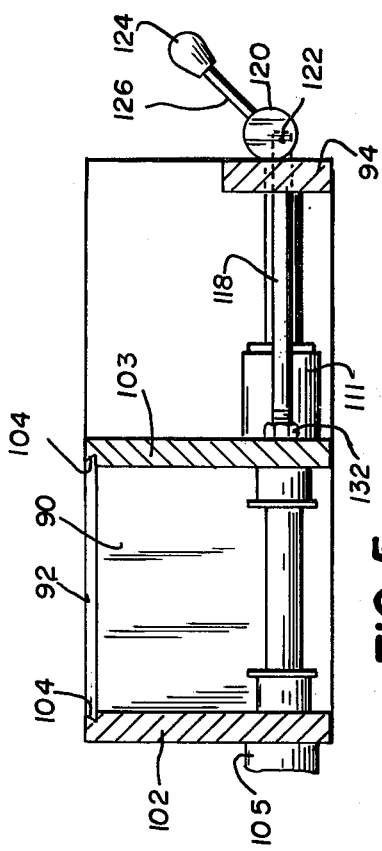
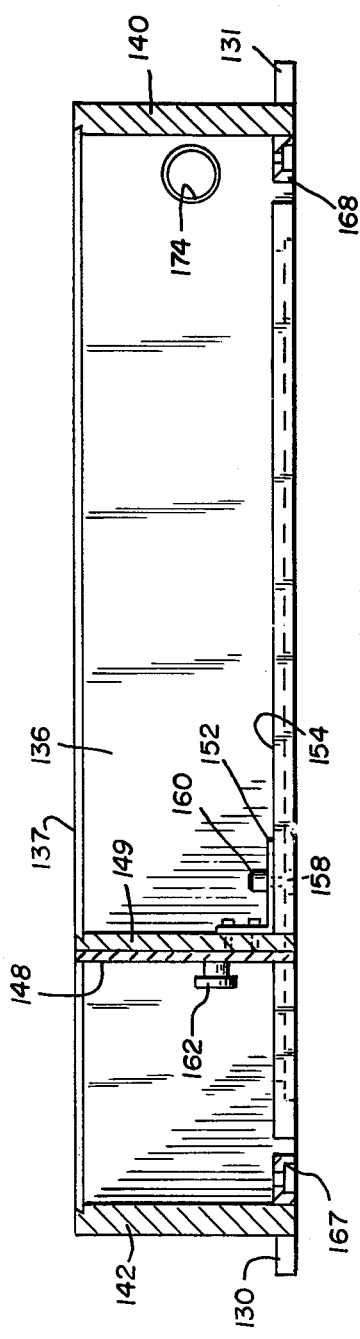
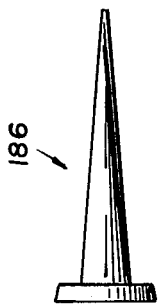
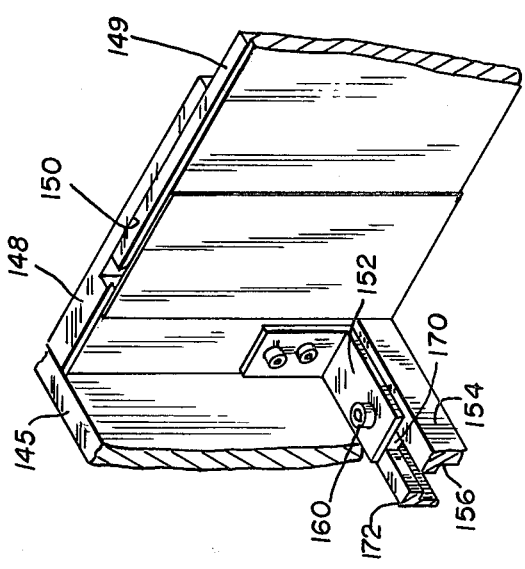

HOLDING FIXTURE AND TRIMMER FOR PC BOARDS

BACKGROUND OF THE INVENTION

1. Field of the Invention

This invention is believed to be found in the classification of art as established in and by the United States Patent Office and entitled, "Work Holders" (Class 269) and in the subclass entitled, "vacuum holding means" (Subclass 21) and also in the subclass entitled, "work holder for electrical circuit assemblages or wiring systems" (Subclass 903).

2. Description of the Prior Art

The apparatus and holding fixtures for use with and by such apparatus was the subject of a pre-Ex search. Although the art is very extensive it did not disclose the present approach to the problem of providing a circuit board trimming device with the holding versatility desired. The apparatus of this invention is readily changeable to accommodate thin and thick boards and small and large sizes. It is realized that the trimming of circuit boards is well known and is the subject of many patents both foreign and domestic. The holding of the circuit board has been and is a problem as the holding of said boards must provide a safe, sure and consistent holding while allowing a very close trimming of the held board in a rapid and fool-proof means.

In the pre-Ex search U.S. Pat. No. 2,668,384 to BARKER as issued Feb. 9, 1954 showed a cam actuator but did not show the holder of the present invention. U.S. Pat. No. 3,229,953 to MUIR, Jr. as issued Jan. 18, 1966 shows a vacuum work holder for articles of various shapes. The showing does not show the holder apparatus as is hereinafter described. U.S. Pat. No. 4,030,717 to SERLOVSKY as issued on June 21, 1977 shows an adjustable work holder for printed circuit boards. U.S. Pat. No. 4,078,302 to FOK et al., as issued Mar. 14, 1978 shows a holder having a cam clamp. This does not suggest the holder as provided in the present invention. U.S. Pat. No. 4,184,472 to BENEDICTO et al., as issued Jan. 22, 1980 shows a vacuum holding clamp. U.S. Pat. No. 4,213,698 to FIRTION et al., as issued on July 22, 1980 shows supporting planar workpieces with pins.

The above patents are believed to be representative of the several found in the field of PC board trimming apparatus but it is noted that the pertinent features of the trimmer of this invention are not shown in the presented combination. As to be more fully described hereinafter the apparatus provides an easily mastered control for the fool-proof and safe operation of the trimming apparatus.

SUMMARY OF THE INVENTION

This invention may be summarized, at least in part, with reference to its objects. It is an object of this invention to provide, and it does provide, a PC board trimming apparatus wherein the board is releasably clamped and an adjustably positioned blade is rotated at a selected speed to precisely cut the extending wires of the mounted components on said board.

It is a further object of this invention to provide, and it does provide, a PC board trimming apparatus in which the board mounting holders may be selectively changed to provide holding means for thick or thin PC boards with thinner or bent or bowed boards held in place by vacuum means. The trimming blade is adjustably positioned and rotated at a selected speed with the blade actuation being achieved when a two handed control and motion is made with the blade rotation being in response to a safety control circuit.

The apparatus to be hereinafter more fully described employs X-Y motion through linear ball bearings mounted on hardened rods. The motor drives a carbide blade that is moved up and down by the operator who controls the desired peripherial speed. This blade is positively carried on the end of the motor shaft and rotation of this motor is stopped by a dynamic brake for a superfast stop. The apparatus shown employs all-electronic control and operation. The cutting blade has at least a carbide edge and the speed of the blade is adjustably controlled by the variable motor so that cutting of copper or copper-based alloys is readily accommodated. Kovar (TM Stupakoff Ceramic & Mfg. Co.) is a known alloy and the cutting is at a slower or lesser speed. Combinations of these wires or leads may be accommodated by speed adjustment.

In addition to adjusting the speed of the motor to accommodate the cutting of the leads the variable speed of the motor also enables the blade to be sharpened as many as forty times with the diminished diameter maintaining the surface speed at the desired cutting peripherial speed. The use of a substantially friction-free movement and the button control of the motor enables the operator to visually control the apparatus.

As PC board are formed or made in various dimensions as well as thicknesses the apparatus is made with easily changeable holding fixtures. A quick release fixture is used when and where the PC board is relatively free from warp. This fixture to be hereinafter more fully described has a cam-operated clamp with the side walls of this fixture disposed to support and retain the PC boards on three sides or edges. It is contemplated that the cutting blade may trim or cut the projecting leads to within about twenty-five thousandths of an inch from the associated surface of the board.

When and where the PC boards are thin, subject to warp or are warped the holding fixture is used with a vacuum that is utilized to draw the PC boards to previously placed standoffs. Usually as many as nine or ten standoffs are positioned so as to support the PC boards when drawn thereto. These standoff's may be positioned precisely and retained in this desired position by adhesive locating strips. In the drawings to be hereinafter shown and described there is a vacuum holding fixture which is adjustable as to size and this fixture is readily mounted to the antifriction carrier.

Guards for the operator to prevent injury from the flying portions of cut ends are contemplated. It is to be noted that the vacuum fixture may be used to accommodate warped boards and draw them to the desired holding position. Conventionally the cutting blade is about four inches in diameter and has a cutting edge that is in the bottom-most plane so that the trimming of the boards is in a precise and predetermined plane. Conventionally this plane is substantially horizontal. The vacuum source is shown as connected to one wall of the fixture and in the opposite wall is provided a quick dump opening to insure that the interior of the fixture is brought to atmospheric pressure in a short period of time.

In addition to the above summary the following disclosure is detailed to insure adequacy and aid in understanding of the invention. This disclosure, however, is not intended to cover each new inventive concept no matter how it may later be disguised by variations in form or additions of further improvements. For this reason there has been chosen a specific embodiment of the X-Y motion apparatus and three holding fixtures, two with vacuum means, as adopted for use in trimming one side of the board and showing a preferred means for retaining said board. This specific embodiment has been chosen for the purposes of illustration and description as shown in the accompanying drawings wherein:

BRIEF DESCRIPTION OF THE DRAWINGS

FIG. 5 represents a side view, partly diagrammatic, and showing an eccentric cam actuation as used with the holding fixture of FIG. 4;

FIG. 7 represents a sectional view taken on the line 7—7 of FIG. 6 and looking in the direction of the arrows and showing particularly the preferred means for providing precise and ready mounting of a PC board in this holding fixture;

FIG. 8 represents an isometric view of a typical angle bracket as used with a T-slot member attached to side and end plates of the fixture of FIG. 6;

FIG. 9 represents a side view, partly diagrammatic, of a typical standoff as used with the fixture of FIG. 6;

In the following description and in the claims various details are identified by specific names for convenience. These names are intended to be generic in their application. Corresponding reference characters refer to like members throughout the several figures of the drawings.

Figure 1:
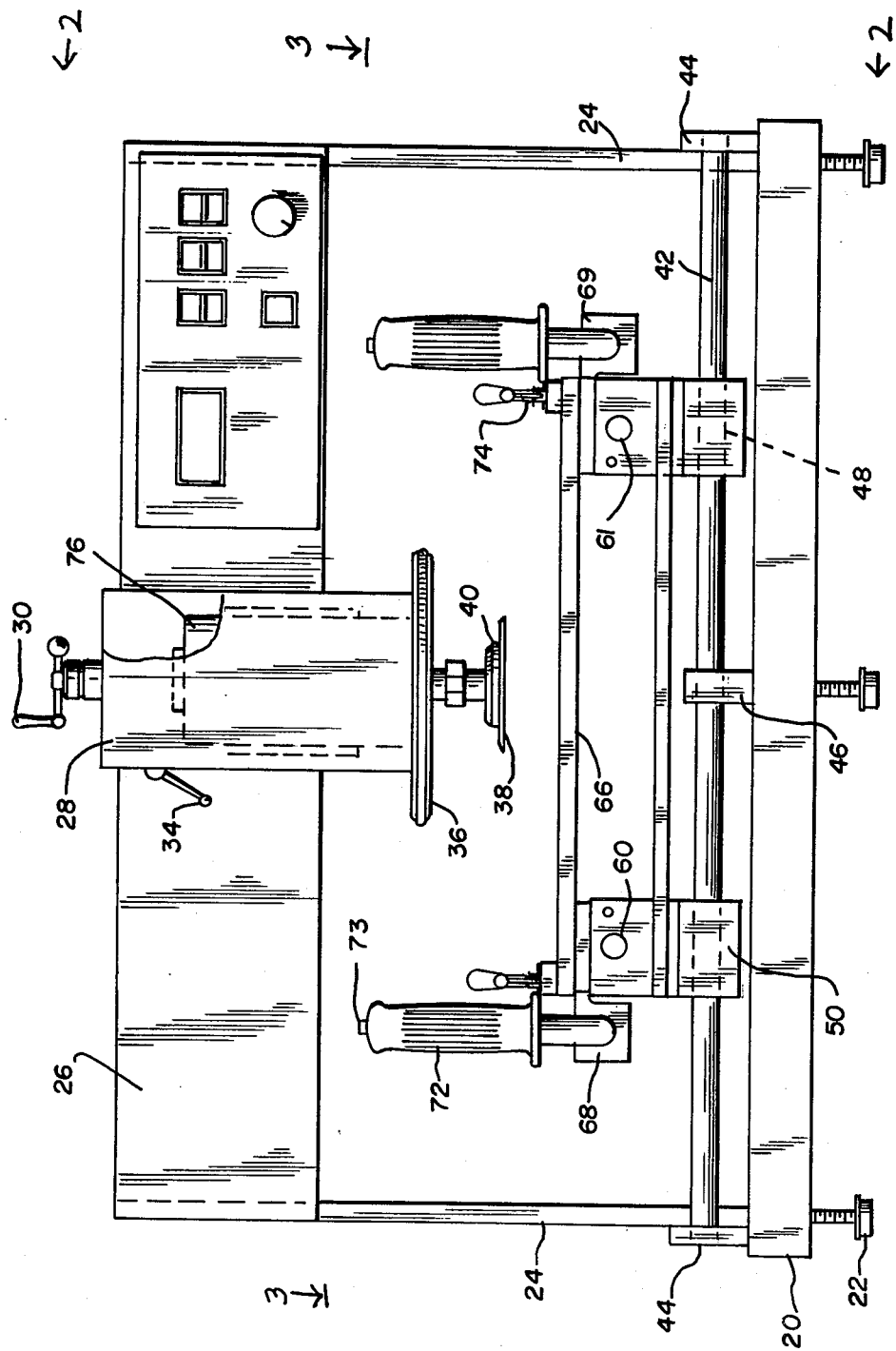
FIG. 1 represents a face of front view of the trimming apparatus absent a holding fixture for PC boards.
Figure 2:
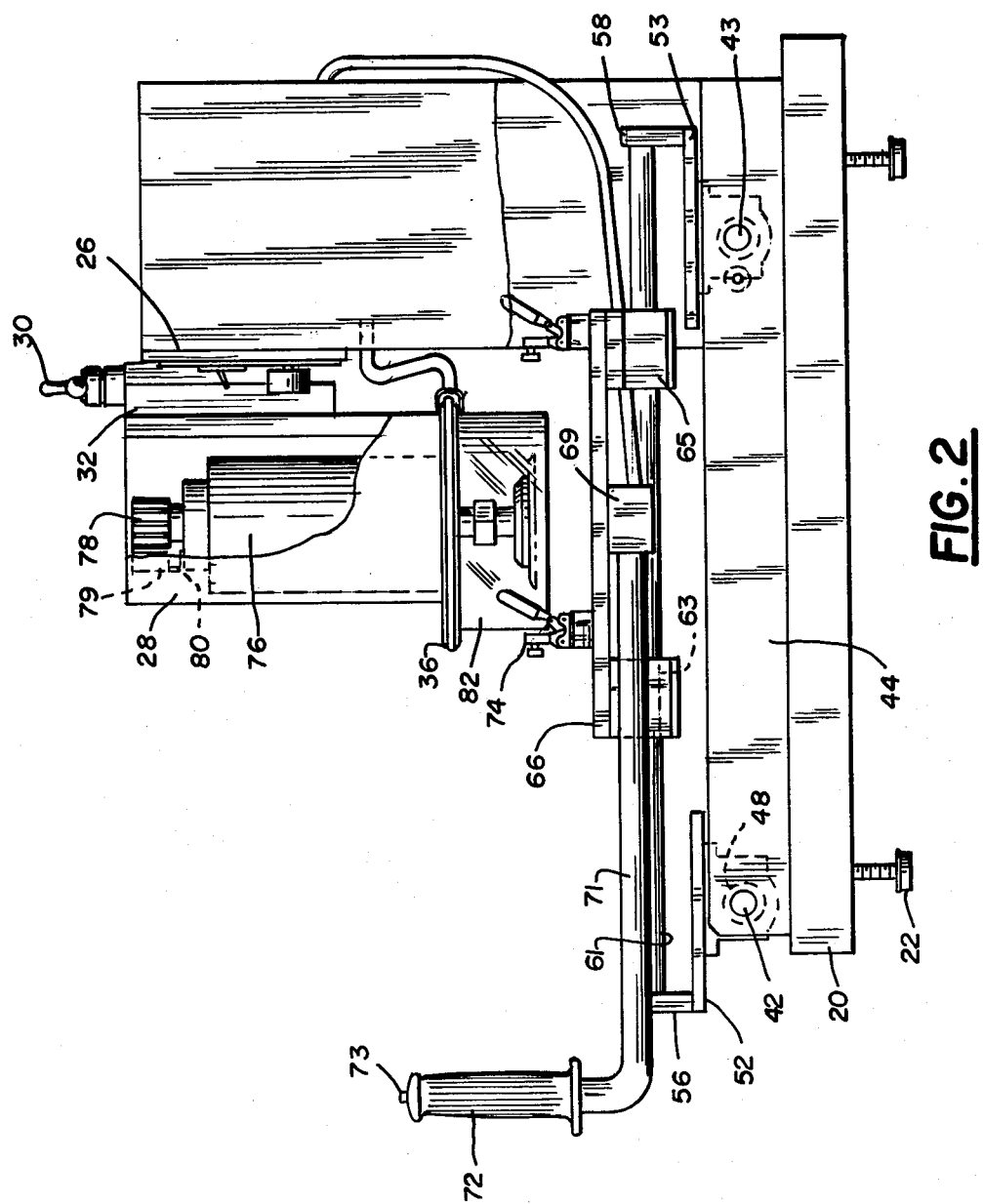
FIG. 2 represents a side or end view of the apparatus of FIG. 1, this view taken on the line 2—2 thereof and looking in the direction of the arrows.
Figure 3:
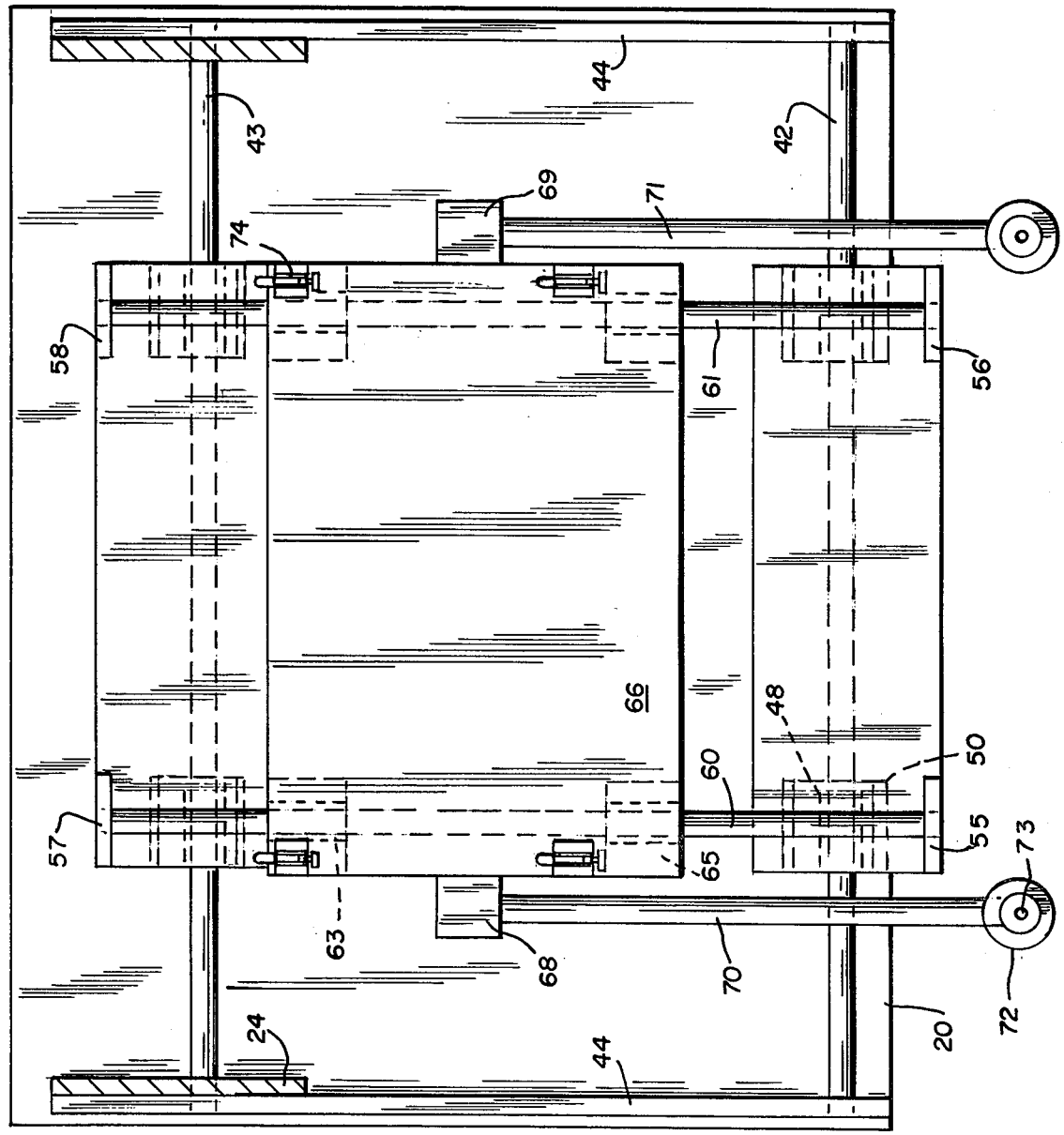
FIG. 3 represents a plan or a top view of the apparatus of FIG. 1, this view taken on the line 3—3 thereof and looking in the direction of the arrows.

Embodiment of FIGS. 1, 2 and 3

The general arrangement of the lead trimming apparatus of this invention is shown in FIGS. 1, 2 and 3. As depicted, the apparatus includes a support base 20 which may or may not be of metal such as aluminium. A plurality of leveling screw members 22 are mounted in threaded holes formed in this plate. These screws enable the trimming apparatus to be placed on a table surface, not shown. Rubber or resilient ends may be provided to prevent marring and/or unwanted movement of the apparatus. End supports 24 carry an upper bridge member 26 which is of hollow construction. The right side as viewed in FIG. 1 carries electronic controls, switches and readouts. The readout may be an LED to indicate the r.p.m's of the motor. Switches may include a power switch, vacuum control, a speed adjusting switch and a reset switch.

Visable in both FIG. 1 and FIG. 2 is a motor housing 28 which is movable up and down within determined limits by a lever knob member 30 to rotate a calibrated lead screw carried within a slide apparatus 32. A lock lever 34 is indicated to the left of the housing 28 and releasably clamps the slide against movement. This lever is manipulated to release the screw when adjustment is desired. A manual and emergency shut-down of the motor is provided by protruding contacting ring 36 disposed above a trimming blade 38 carried by and on a blade holder 40 to be hereinafter more fully described in conjunction with FIG. 14.

Below this trimming blade 38 is disposed the X and Y (rectangular) motion mechanism. On the support base 20 is mounted a pair of hardened steel rods 42 and 43. These rods are carried at their ends by like end plates 44 which are secured to the plate 20 by cap screws entering into threaded holes in these plates. Deflection of these rods is prevented by support blocks 46 disposed at substantially the midpoint of the rods and secured to the base 20 by cap screws as for the end plates 44. These longer rods are contemplated to provide the transverse movement of said mechanism.

Linear ball bushings 48 are carried in housing blocks 50. As seen in FIG. 2 these housing blocks 50 are carried on and are secured to front and rear plate portions 52 and 53 which carry end supports 55, 56, 57 and 58 which are alike or similar. These end supports are precisely made and positioned to carry shorter hardened steel rods 60 and 61 which provide the "in and out" path or guided movement of the motion mechanism. On these rods 60 and 61 are mounted linear ball bushings 63 in housing blocks 65. These blocks carry and are secured to an upper carrier plate 66. Right and left hand block mounts 68 and 69 are secured to this plate 66 and carry tube or pipe members 70 and 71 which are bent to provide substantially a right angle support means.

The upstanding legs of the tube or pipe members 70 and 71 have formed grips 72 and from the top thereof is a switch button 73 which must be energized to provide actuation of the motor. Quick-acting and like toggle-type clamps 74 are provided at four positions to engage and removably retain PC holding fixtures to be more fully described in relation to other and later figures.

In FIG. 2 a motor 76 is shown as carrying the trimming blade 38 on and by the end of the motor shaft. The speed of the motor is adjusted to provide the desired rotation of said blade. This rotation is read by an electronic tachometer which includes a lobed end member 78 which is read by a magnetic counter 79 carried by a support 80. This device is much like the electronic ignition used in a late model automobile. The rods 42 and 43 providing the transverse guiding and the rods 60 and 61 providing the "in and out" motion path needs be precisely spaced and positioned. Usually as pairs, the rods are at substantially at right angles to each other but they are in planes that are parallel to each other and to the plane of the blade.

Rubber or resilient bumpers are provided to insure that the X and Y motion does not terminate in and with an abrupt stop. It is to be noted that although the tube or pipe members 70 and 71 are secured at the end terminating in the horizontal extent this portion is disposed to always be outside the rods 60 and 61 providing the "in and out" guide control. The use of pipe or tubing for the handle grips is a matter of preference as other support means can and may be used. The use of two spaced switch means in these handle grips 72 insures that an anti-tiedown push button control is provided. In FIG. 2 there is indicated a transparent curtain 82 that is provided with the motor housing 28 to insure that any severed wire leads do not fly into the eye of the operator. Usually the operator has additional safety protection including safety glasses or the like.

Figure 4:
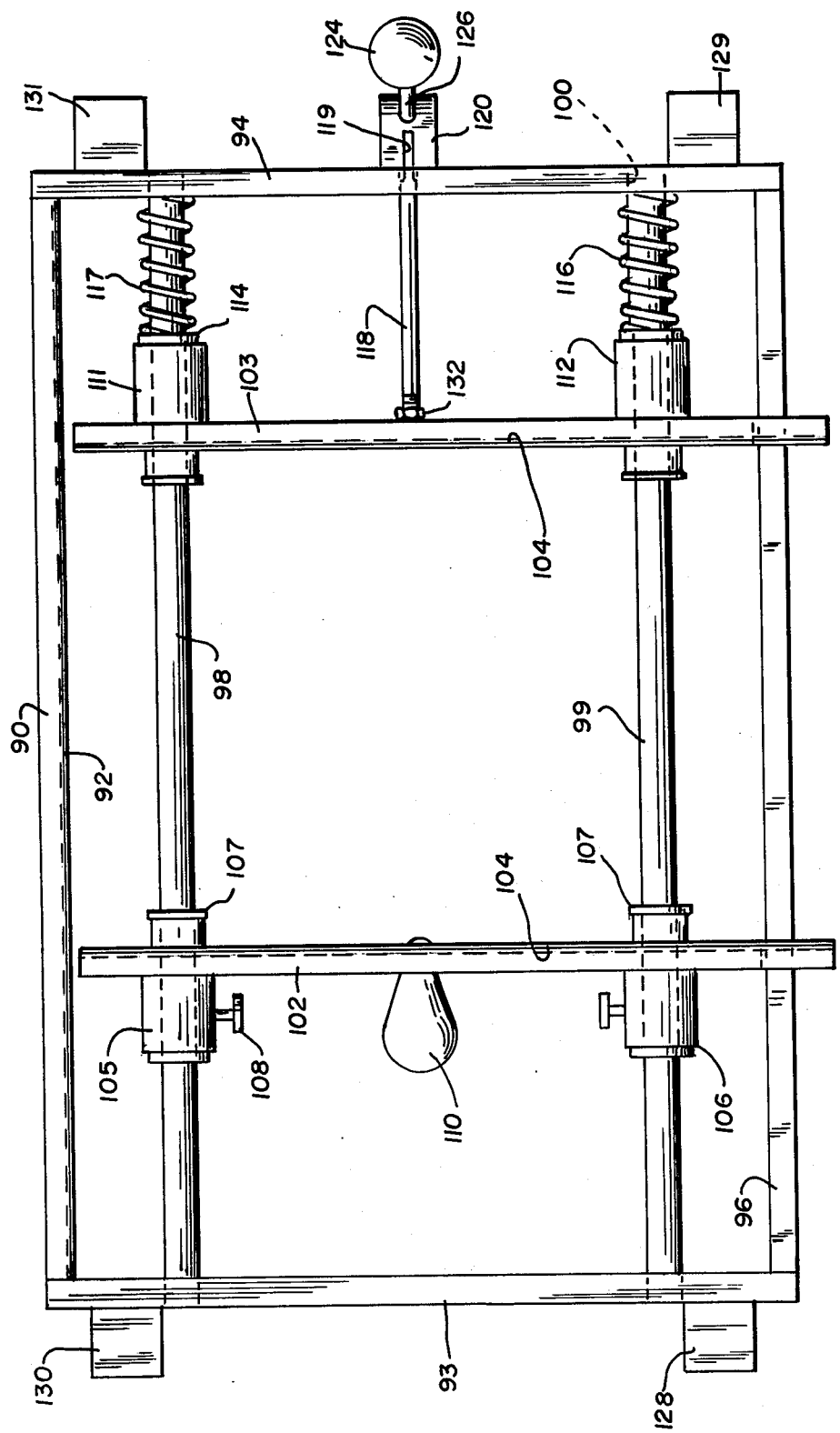
FIG. 4 represents a plan view of a holding fixture for trimming boards that are not and probably will not warp or bow through or because of trimming, this holding fixture having one longer side member movable and clamped by a quick release means.

Embodiment of FIGS. 4 and 5

Referring next to a quick release fixture for PC boards as shown in FIG. 4, the fixture is adapted to be releasably and quickly secured to the X-Y mechanical motion movement apparatus as shown in FIGS. 1 through 3 above described. This fixture is adapted for holding PC boards that have not developed and are not likely to develop a warp. These boards conventionally are of a thickness and/or composition so as to preclude warping during trimming. It is to be noted that this fixture engages only the extreme edges of the PC board and the component side is disposed to accommodate a three inch depth. More depth may be accommodated by a fixture with greater side and end members.

As shown in FIGS. 4 and 5, the fixture of FIG. 4 has a rear longitudinal supporting member 90 formed with an upward and inner lip or edge 92. This member is conventionally a plate and to this member 90 is attached, as by cap screws, end members 93 and 94. These end members do not have shoulders and in fact are much less in height than is the rear plate member 90. A front extending member 96 is of the same height as end members 93 and 94 and is secured to these members also by cap screws, not identified. Carried in and by end members 93 and 94 are rods 98 and 99 which conventionally are of steel and are secured in precisely positioned and formed holes 100 in said end members. A pair of movable and like interior support plates 102 and 103 are shown. These plates are of like configuration with shallow edge grooves 104 facing toward each other. The end opposite the supporting member 90 in each plate is provided with a notched portion adapted to pass over the extending member 96.

Like bushing housings 105 and 106 have a reduced neck portion that is a press fit in appropriately formed holes in movable support plate 102. A through bore is adapted to receive and retain oil impregnated bronze or similar bearings 107 that are mounted in through bores in said housings. As depicted, these bearings are with enlarged or flanged ends to limit their inner mounting limit. Thumb screws 108 are seen as providing a lock on the shaft passing therethrough. Extending leftward from about the midpoint of this plate 102 is a secured manipulating knob 110.

Plate 103 is likewise movable and housings 111 and 112 are like or similar to those provided for plate 102. These housings also have a through bore in which are carried two bearings 114. These bearings are a slide fit on rods 98 and 99. As above these bearings have flanged ends to limit the inward mounting of the bearings. As above, the reduced diameter portion of the housings 111 and 112 are a press fit in appropriately formed and placed holes in plate 103. Springs 116 and 117 are each mounted on the corresponding shafts.

The movable plate 103 has a threaded hole provided in and at its midportion and mounted therein is the threaded end of a draw rod 118. As seen in FIG. 4, the right end of this rod is made with flat sides to fit in and slide in a slot 119 formed in a toggle clamp piece 120. This piece is conventionally made from round metal stock and after being cut to length has the slot 119 formed therein. A dowel 122 is a press fit in either the rod or in apertures formed in piece 120. A knob 124 is mounted on the distal end of stub 126 whose other end is mounted in a threaded hole in piece 120.

Use and Operation of the Holding Fixture of FIGS. 4 and 5

This fixture is readily secured to the X and Y mechanism through mounting ears 128, 129, 130 and 131 which are engaged by like quick-acting clamps 74 shown in FIG. 2. The rear supporting member provides the rear stop limit for a PC board which uses the edge 92 to establish the support for the rear of the board. Plate 102 is positioned along the rods 98 and 99 after the thumb screws 108 are loosened. The plate 102 is positioned as desired and the thumb screws 108 are again tightened so that this plate is positioned to provide a supporting edge means at the left edge of the PC board. The knob 110 assists in positioning the plate 102. It is to be noted that the plate 102 is easily slid along the rods 98 and 99 when and while the thumb screws 108 are loosened.

The plate 103 provides the support for the other edge of the PC board that is to be trimmed. The draw rod 118 is mounted in the threaded aperture in plate 103 which is moved inwardly (leftwardly) by springs 116 and 117 to bring the plate 103 to its inner position whereat it engages and grips the PC board. The plate 103 is moved toward member 94 (rightwardly) when the piece 120 is caused to provide a greater throw. This is when the toggle clamp piece is rotated from the position of FIG. 5 whereat the knob 124 is at the position shown. The cam action utilizes a motion whereat the PC board is lightly gripped by the spring bias as it moves the plate 103. The outward release of plate 103 is against the spring bias and the knob 124 is usually moved about sixty degrees towards the horizontal.

It is to be noted that the PC board is gripped and retained by three edge portions and the three plate members 90 and 102 and 103. The inwardly disposed edge portions 92 and 104 provide stop shoulders for the edges of the PC board.

This fixture is easily and rapidly removed from the X and Y motion mechanism by actuating the clamps 74 to the open or release condition whereat and whereby the fixture is easily removed. To again mount the fixture to the X and Y motion mechanism the fixture is placed on the upper carrier plate 66 and with the ears 128, 129, 130 and 131 positioned to be engaged by the clamps 74. These clamps are again toggled or moved to the retaining position to hold this fixture.

This fixture is reloaded with and by a to-be-trimmed PC board that is like or similar to those that have been previously trimmed. This PC board is placed and positioned in the fixture with lips or shoulders 92 and 104 engaging the side and rear of the PC board and the right movable member 103 brought to the right side of the PC board. The clamp piece 120 is moved so that plate 103 is a short distance from the engaged condition. The springs 116 and 117 provide the retaining pressure on the PC board when the clamp piece 120 is manipulated to the closed condition.

Another sized PC board may be accommodated in this same fixture by loosening thumb screws 108 and positioning member 102 so that this PC board is supported on three sides as above noted. The thumb screws 108 are again tightened and as above noted the final grasp of the PC board in the fixture is by springs 117 and 118 after manipulation of the quick-release clamp piece 120 as shown in FIG. 5. Nut 132 is tightened to retain the draw rod 118 in the desired orientated position. This nut 132 locks draw rod 118 and the quick-release clamp piece 120 in the desired position.

In operation, the quick-release clamp piece 120 is manipulated to draw or move member 103 against the bias in the compression springs 116 and 117. To release the board from the fixture the lever is manipulated to draw the bar or plate 103 rightwardly against the bias of said springs after which the PC board is slid forwardly along the grooves 104 and then released and removed from the fixture. It is to be noted that with an open front the PC board and the downwardly disposed secured components are not disturbed by the sliding action.

Another PC board of a like size is now slid into the grooves 104 in plates 102 and 103 and to the lip 92 after which the quick-release toggle cam clamp is manipulated to cause plate member 103 to be moved leftwardly into a holding condition after which the PC board is trimmed. It is to be noted that the pin 122 may be fixedly retained in the end of draw rod 118 and is rotatable in apertures in member 120 or vise versa. In other words the pin 122 is fixed in one member and rotatable in the other. Snap rings or other means may be provided to make this pin rotatable in both. The stud 126 is shown with a threaded end mounted in knob 124 and the other end in a threaded aperture in clamp piece 120. Knob 124 may be secured to clamp piece 120 by means other than stud 126 and threads.

Figure 6:
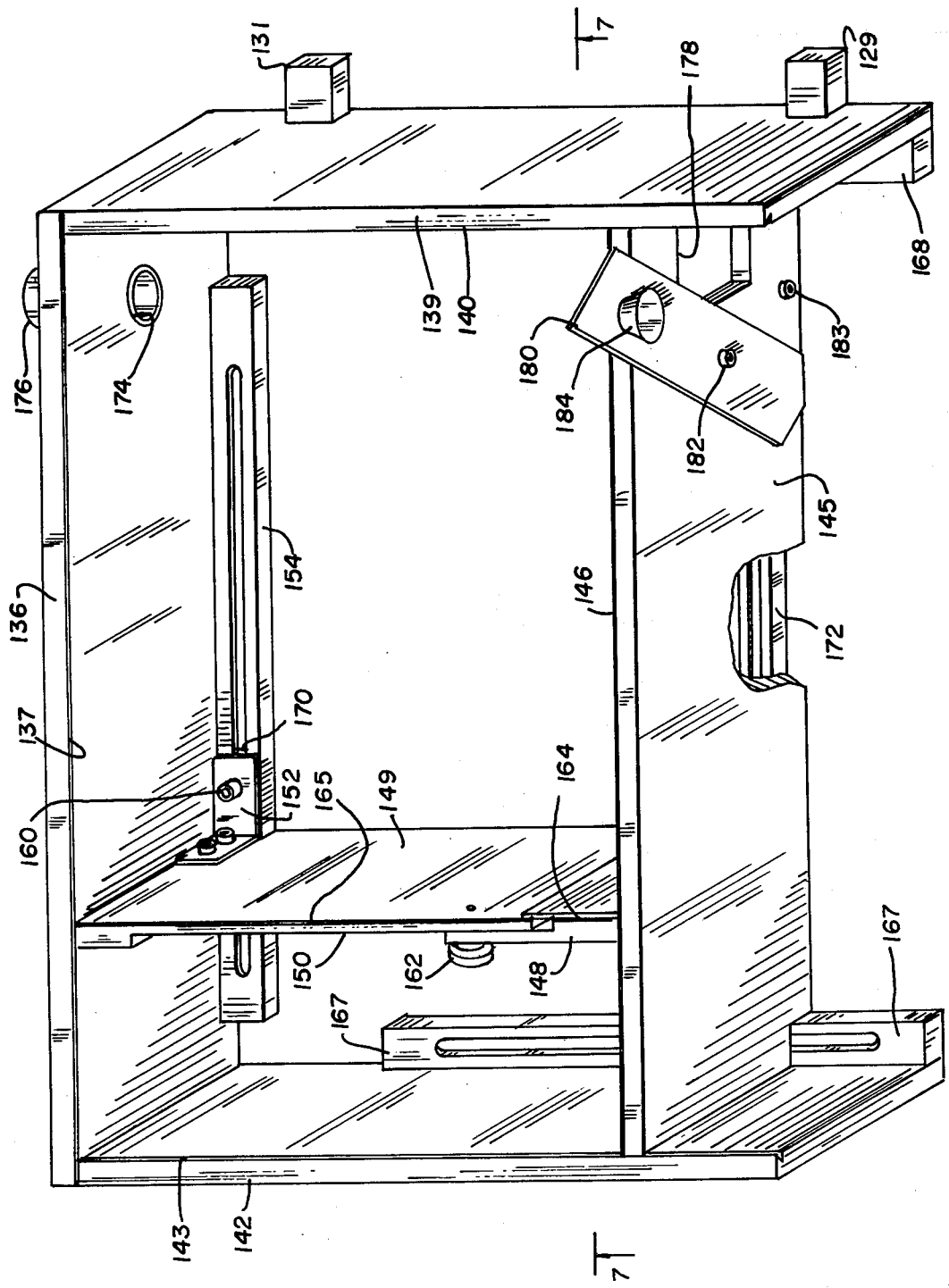
FIG. 6 represents an isometric view, partly diagrammatic, and showing a holding fixture for thinner PC boards subject to warping or bowing, this fixture having four side members each adjustable and all having retaining shoulders formed thereon, this fixture having means for connecting the interior to a source of vacuum and having a gate which is opened for negating the vacuum in the fixture.

Holding Fixture of FIGS. 6, 7 and 8

The PC boards that are warped or may become warped with and by the trimming of one face are retained in place by and with vacuum applied to hold the PC boards in place during trimming. As the PC boards may be received in a warped condition or may become warped during trimming, said trimming by holding the boards with this fixture permits the rotating knife to be brought to as close as fifteen thousandths of an inch. This fixture is readily mounted on the X and Y mechanism of FIGS. 1, 2 and 3 by four extending tabs or ears 128, 129, 130 and 131. A rear plate member 136 is formed with a shoulder 137 which is a groove formed in the top surface and at the inner edge. A right end plate member 139 is also formed with an inwardly facing shoulder 140. A like left end plate 142 in which the top shoulder or groove 143 is like that of plates 136 and 142 has identical shoulders to provide a predetermined height.

A movable or adjustable plate 145 also has an inward facing shoulder 146 which mates with and is the same height as shoulders 137, 140 and 143. An adjusted wall or closure that extends between plates 136 and 142 utilizes two plate members 148 and 149 and provides a lap joint construction with the member 149 having a cutout 150 which is sized to receive an extending end of the plate member 148. The far end of plate member 149 has a thickened end to provide tapped holes for attaching the end of plate 149 to an upstanding leg of an angle bracket or support 152. The other leg of this support is positioned above a T-slot guide and retainer 154 which is attached to the rear plate 136 as by cap screws not shown. This retainer 154 is formed with the enlarged guide portion 156 in and at the downward face. In this enlarged guide portion as seen in FIG. 7 a T-nut 158 is free to slide but not turn. A compatible threaded hole in this T-nut engages a threaded end of a cap screw 160. A stud may be mounted in this hole and a nut mounted thereon to tighten the bracket 152 in the adjusted position.

The PC board is positioned and the side members are then adjusted to accommodate this board. The rear plate member 136 is of a fixed size or extent and the shoulder 137 provides a shelf and stop against which the end of the PC board is positioned. The right end member 139 is a fixed member but provides the right ledge and stop for the edge of the PC board. The length or depth of the PC board is now determined and members 148 and 149 are made of this length. A thumb screw 162 is depicted as holding the lapped plate members 148 and 149 in the desired position. It is to be noted that plate member 149 is conventionally made of and with one inch increments which allows an adjustment within one inch. If desired, the plate member 148 may be the member made in one inch increments. A shoulder 164 and 165 is formed in the upper edge of members 148 and 149 and this shoulder is in those portions that extend toward the right end plate 139.

Movable plate 145 is formed with notches at the lower corners to mate with and slide by T-slot retainers 167 and 168. These retainers are of like construction and a like angle support 152 is mounted in each slot. A wiper or filler member 170 is provided with each angle support to prevent unwanted vacuum escape from the chamber. The plate 145 also carries a T-slot retainer 172 similar to, if not identical to, retainer 154 secured to rear plate 136. Angle brackets 152 holds the plate members 148 and 149 in the upright and placed position.

Movement towards and away from right end plate member 139 is provided by the T-slot retainer 154 mounted to rear plate member 136 and a like T-slot member 172 secured to the movable plate member 145. It is to be noted that as depicted that rear plate member 136 is formed with an aperture 174 and a short length of tubing 176 as shown. This rearwardly extending tube is connected to a source of vacuum not shown. The opposite plate 145 is formed with a through aperture 178 and a closing lever plate 180 is pivotally secured to the outside of this plate member 145. Said pivot may be a screw or pin that is adjustable to insure a tight sliding fit. Shown is pivot screw 182 with the lower stop limit provided by a pin or screw 183. A knob 184 is shown as secured to the outer portion of the lever plate 180 as by a pin or screw.

Standoff of FIG. 9

In FIG. 9 is shown a typical standoff which is identified as 186. This standoff may be made of acrylic or aluminum and is customarily furnished to the user in multiples such as ten. It is to be noted that the upper or PC board supporting end of this standoff is tapered to about one-eight of an inch in diameter. The base may be about one inch in diameter. These support standoffs 186 are often secured in place by double faced adhesive. The fixture of FIG. 6 may have its own base plate or may use the plate above the X—Y mechanism. This base plate may be with the fixture to provide a desired closure of the bottom of the chamber and to provide a permanent seating of the standoff 186. If the fixture is contemplated to be changed after the run the securing of the standoffs and a separate plate for them is not necessary.

Use and Operation of the Fixture of FIGS. 6, 7 and 8

It is to be noted that this fixture employs vacuum for the hold down force. The shoulders 137, 140, 146 and the shoulders 164 and 165 on plate segments 148 and 149 are positioned to just retain the PC board to be trimmed. The components on the PC board are considered and the standoffs 186 are positioned so as to avoid engagement with any of the mounted components. Aperture 178 is closed by manipulating the lever plate 180 to a closed condition. The vacuum to the fixture chamber may now be actuated when the PC board is in place.

The PC board is placed within the retaining shoulders 137, 140, 146, 164 and 165. The standoffs 186 are positioned as desired and secured components are positioned on the downward side of the PC board. The standoff 186 avoids the attached components and supports the PC board in those areas in which components are not present. The vacuum applied to that portion of the fixture between members 136, 139, 145 and adjusted wall of 148 and 149 is substantially air-tight when the PC board is placed in trimming condition and pushed to the shoulder.

It is realized that this fixture may not be completely tight as to loss of vacuum but the holding power of the negative pressure and the formed shoulders are sufficient for the trimming operation. The vacuum is actuated to move the thin and warped PC board into the retained position during the trimming of said PC board. The standoffs 186 prevent unwanted bowing of the board during trimming.

This fixture is easily adjusted as to the size of the board to be trimmed by loosening the angle brackets 152 through manipulating the screw 160 that enters and tightens the T-nut 158. The plates 148 and 149 are selected and adjusted to the desired length. Any leak of vacuum between the plates 148 and 149 at the shoulders 164 and 165 is minimal since the PC board rests on and engages the horizontal supporting surface of said plates. The cutouts in plate 145 are formed to be a close fit of the T-slot members 167 and 168. After the PC board has been trimmed the vacuum is stopped and the lever plate 180 is manipulated to bring the interior of the fixture to atmosphere. The vacuum may be continuously applied if desired and the lever plate 180 manipulated to cause vacuum to be applied at the time interval desired.

Figure 10:
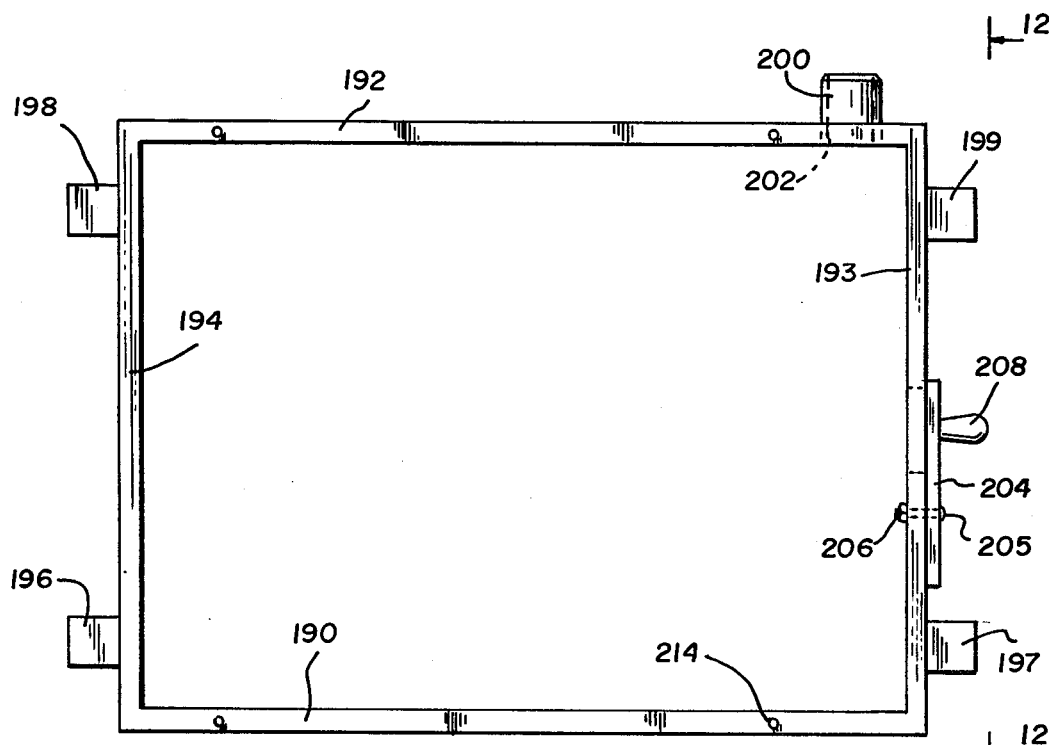
FIG. 10 represents a front view of an alternate holding fixture utilizing vacuum for a hold-down assist, this view partly diagrammatic.
Figure 11:
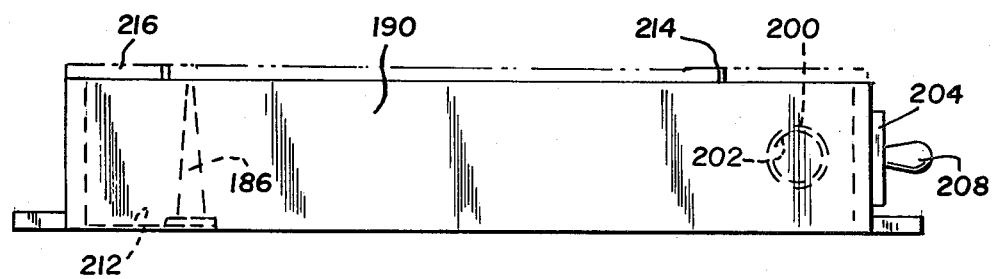
FIG. 11 represents a side view of the holding fixture of FIG. 10, this view partly diagrammatic and taken on the line 11—11 thereof and looking in the direction of the arrows.
Figure 12:
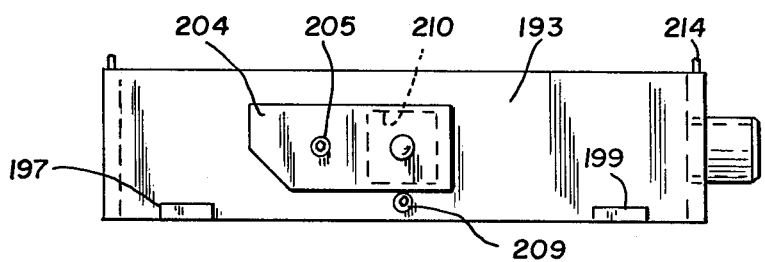
FIG. 12 represents a top or plan view of the holding fixture of FIG. 10, this view partly diagrammatic and taken on the line 12—12 thereof and looking in the direction of the arrows.

Alternate Holding Fixture as in FIGS. 10, 11 and 12

In trimming PC boards many are of small size and it is a great advantage to hold and trim at one time a plurality of boards alike or of a different configuration. In trimming smaller PC boards it has been found that a vacuum hold down is an advantage and provides a ready mounting. The vacuum box or chamber depicted in these FIGS. provides longer front and rear plate members 190 and 192 and right and left end plate members 193 and 194. These members are secured together by cap screws and tapped holes, not identified. Other securing means such as epoxy may be used if desired. Four like extending ears or tabs 196, 197, 198 and 199 are secured to this fixture and are used to secure said fixture to the X and Y mechanism by clamps above identified.

A conduit 200 is mounted and secured in an aperture 202 in rear plate member 192 and in the right end plate member 193 is a quick opening and control of the vacuum in the interior of the fixture. A lever plate 204 is pivotally secured to right end member 193 by a screw 205 and nut 206. A knob 208 is secured to lever plate 204 and is grasped to manipulate this lever plate to and from a closed condition. A stop screw 209 limits the closing position and when the lever plate 204 is moved to the open condition, aperture 210 is exposed or uncovered to allow the interior of the fixture to approach the atmospheric condition.

An internally positioned plate 212 as shown in phantom outline is placed within said fixture and a selected plurality or multiplicity of standoffs 186 are secured to this plate 212. These standoffs are placed in selected positions and are secured to provide support for the PC board to be trimmed. The upper surface of the front and rear plate members 190 and 192 are positioned with upwardly extending dowells or pins 214 which are positioned and mate with holes provided in a top plate 216. In this plate are machined cutouts that engage and retain the several contours of the PC boards that are to be trimmed. The machined cutout is provided with shoulder supports when and where desired.

Use and Operation of the Fixture of FIGS. 10, 11 and 12

The X and Y mechanical apparatus of FIGS. 1, 2 and 3 is used to move the PC boards under and away from the cutting blade as rotated by the motor. The PC boards either alike or dissimilar are placed in the cutouts in the plate 216. The fixture and standoffs 186 are fixed and when the fixture is mounted to the mechanism by quick-acting clamps 74 the fixture is at the desired position. The source of vacuum is connected to the conduit 200. For and during trimming, the lever plate 204 is manipulated to close aperture 210 and allow the interior of the fixture to reach a condition of negative pressure. During trimming by the rotating blade 38 the negative pressure maintains the PC boards in a retained downwardly moved condition and the shoulders and standoffs maintain the desired position. After trimming the vacuum is shut off and the lever plate 204 is raised to uncover aperture 210.

Figure 13:
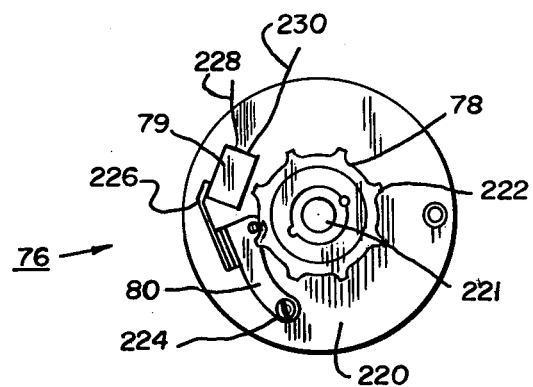
FIG. 13 represents a partly fragmentary and diagrammatic plan view showing a means for displaying the rotational speed of the motor on a LED.

Tachometer Assembly of FIG. 13

The motor provided for rotating the trimming blade is an adjustable speed motor 76 and as shown in FIG. 2 and FIG. 13 includes an interior housing 220 and extending upwardly is shaft 221 on which is mounted rotating member 78. This rotating member is formed with a plurality of protrusions 222 which as depicted are eight in number. A lever arm 80 is secured to the housing 220 by means of a cap screw 224 and an attached support 226 carries a pulse counter device 79 which is conventional. The pulses caused and/or produced by the protrusions 222 are carried to a solid state control circuit by lead wires 228 and 230. The speed of the motor is read and adjusted by a solid state circuit partly shown and described hereinafter in connection with FIG. 15.

Figure 14:
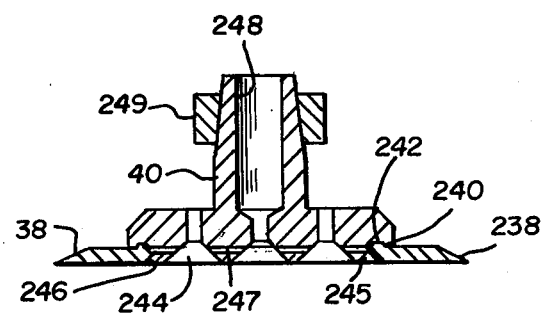
FIG. 14 represents a sectional side view, partly diagrammatic, and showing the trimming blade as carried by a holder mountable on the extending shaft of the motor.

Blade Mounting Holder of FIG. 14

The blade 38 is conventionally of very hard material such as carbide or the like. High speed hardened tool steel may also be employed. As seen in this FIG. 14 the bottom surface of the blade is made with a slight hollow ground configuration and as reduced-to-practice is about one degree so that resharpening is only required along a ground beveled angle 238. A flanged holder or arbor member 40 has a groove 240 that is sized and shaped to receive a mating shoulder 242 formed on the blade 38. A plurality of flat headed cap screws 244 enter and are retained in threaded apertures in holder 40. These flat head screws, usually three in number, pass through and retain a disk 245 which seats in a tapered bore 246 in the blade 38. It is to be noted that this disk in its mounted condition has a small space 247 between the blade and the holder interior of shoulder 242 allowing the disk 245 to be secured without extending below the blade cutting surface. This holder is made with a tight bore 247 that is sized to be a tight fit on the shaft of the motor. A tightening nut 248 is conventional and is used to retain the holder 40 on the shaft end of the motor.

Figure 15:
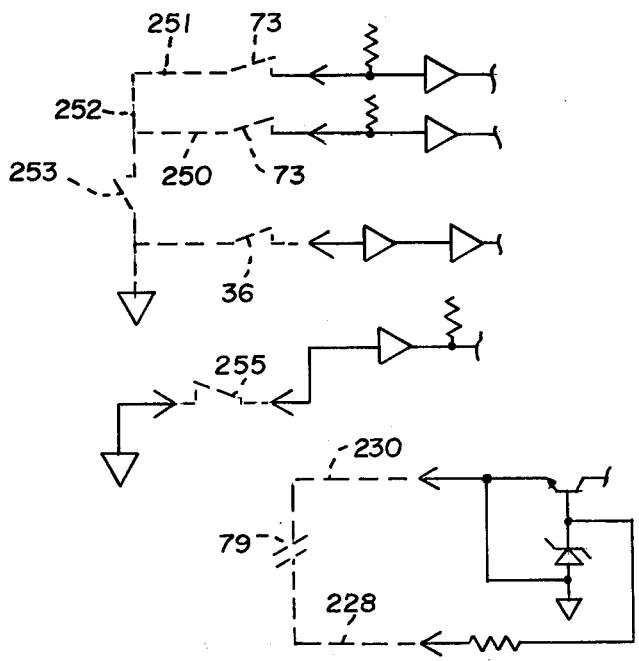
FIG. 15 represents a fragmentary circuit diagram showing the preferred solid state control and use of the switches and emergency shut-off for the motor carrying and rotating the trimming blade.

Circuit Diagram of FIG. 15

Referring next and finally to the circuit diagram as shown in FIG. 15, a complete solid state circuit for this apparatus is not shown as many changes could and may be made particularly for special applications. The fragmentary top portion of this circuit as depicted is used with the grips 72. Each grip has a switch button 73 which is actuated to complete a circuit. The switches 73 are closed by the operator's right and left hands and through conductors 250 and 251 carry a signal through conductor 252 to a control switch 253. A safety switch is associated with the emergency shut down of the motor 76 that is carried by the ring 36 as in FIG. 1. A manual restart switch 255 is shown in the circuit and is actuated to again bring the motor to actuating condition.

This circuit also shows the magnetic counter 79 carried on the end of motor 76. Lead wires 228 and 230 extend from this counter and by an adjustable control the speed of the motor is increased or decreased to conform to the LED display of motor speed on the control panel. The use of transistors, resistors and like solid state circuit components is a matter of design and no patentable distinction is ascribed to their use and arrangement in the complete circuit.

This apparatus provides a fixture and carrier assembly that rides on a low friction means and moves in an X and Y direction. A motor that rotates a carbide trimming blade is adjustable as to rotational speed and this speed is read by a LED. A control adjusts this rotation to conform to the desired circumferential speed of the blade. An anti-tie-down push-button safety control requires two handed actuation with thumbs in place during trimming. The blade speed is set to provide a long blade life before sharpening and blade speed is adjusted to cut cupper, Kovar or combinations thereof.

The holding fixtures are quickly and easily retained or removed by toggle clamps and associated ears. Three fixtures are above described. A first fixture is for rigid PC boards that are not warped and are not likely to warp. These PC boards are supported on three edges and a quick acting cam clamp is actuated to retain and then release the PC board. A second fixture provides a four plate box construction and vacuum is used to retain this PC board at areas which do not have electrical components. The vacuum into the fixture is negated when an aperture in one of the side walls is uncovered to bring the interior to atmosphere. A third fixture uses a top plate in which retaining pockets are formed to receive small and/or irregular shaped boards. Vacuum and standoffs are again utilized with a manipulable lever plate actuated to uncover an aperture to bring the interior of the fixture to atmosphere.

It is to be noted that the retaining grooves are depicted as with a dovetail or inwardly slanted or sloped sidewall which provides a gripping means that additionally urges the gripped board downwardly toward the support surface. This does not preclude the forming of this groove with an added small undercut to accommodate boards with burrs on less than perfectly trimmed edges. The composition of the PC board may require a special groove. Whatever the configuration, it is intended that the held board be supported at and on the horizontal surface so that repetitive trimming of a PC board at a precise plane may be achieved.

The grooves or shoulders 137, 140, 143, 146 and 164 in the end and edge plates of the fixture shown in FIGS. 5, 6 and 7 do not grip the PC board tightly but only provide a retaining guide. The vacuum that draws the board to the support standoffs 186 insures that the board is seated on the horizontal shoulder. Shoulder 146 may be eliminated in the movable member 145 but the the PC board that is trimmed must be lifted from the retained condition without disturbing the mounted components. Retaining grooves at all edges are customarily provided so that accidental dislodgement does not occur but fixtures for particular boards may be provided.

It is to be noted that the above apparatus and fixtures provide a basis for a method claim and accordingly the following method steps are noted and include providing a base with a support plate; mounting an X and Y motion mechanism which is movable by an operator in a prescribed plane with said X and Y mechanism carried by and above said base and including means to retain this motion mechanism with and by means requiring minimal effort by an operator; mounting a motor and a cutting blade thereon so as to be rotatable in a plane substantially parallel to and above the prescribed plane of the X and Y motion mechanism, the rotational speed of the blade being adjusted by the speed of the motor; counting a carrier on said X and Y motion mechanism and providing limit stops for operator manipulation and by a control circuit insuring safety of the operator during trimming; providing a removably mounted holding fixture so as to position the upward surface of the PC board or boards in a plane substantially parallel to the plane of the rotating trimming blade and providing means for ready retention and release of successive boards.

The above apparatus has been commercially produced and is intended for easily trimming like PC boards at a high rate and in a very precise manner. Conventionally, the electrical components are mounted on one face of the boards and the leads to be trimmed extend from the other face. This trimmer is disposed to trim the extending leads and where the fixture holds a thicker PC board the trimming can be as close as twenty-five thousandths of an inch and where vacuum assist is provided the trimming may be as close as fifteen thousandths of an inch.

Terms such as "left", "right", "up", "down", "bottom", "top", "front", "back", "in", "out" and the like are applicable to the embodiments shown and described in conjunction with the drawings. These terms are merely for the purposes of description and do not necessarily apply to the position in which the apparatus and fixture for holding and trimming PC boards may be constructed or used.

While a particular embodiment of said apparatus and three fixtures have been shown and described it is to be understood the invention is not limited thereto and protection is sought to the broadest extent the prior art allows.

What is claimed is:

1. A method for holding and trimming the upper face of a PC board which includes the steps of:
   (a) providing a base support including a plate member;
   (b) mounting an X and Y motion mechanism on said base plate member with said mechanism movable in a prescribed plane above said plate, this mechanism movable by operator manipulation and with minimal friction and effort;
   (c) carrying a motor and cutting blade in a plane substantially parallel to and above the prescribed plane of the X and Y motion mechanism, said blade rotatable by said motor at a selected speed;
   (d) mounting a carrier on this X and Y motion mechanism and with this carrier movable by and with the X and Y motion mechanism and establishing limits of motion of this motion mechanism as actuated by an operator;
   (e) providing a safety control circuit with said mechanism to insure that a trimming step occurs only when and while the operator moves the motion mechanism in a foolproof and safe manner during manipulation, and
   (f) removably mounting a holding fixture on said carrier and with this fixture having at least three upstanding side holding plates and providing in said side plates means for retaining and positioning the upper surface of said PC board or boards toward the cutting blade and in a plane that is substantially parallel to the cutting plane of the blade edge and providing means for ready retention and release of successive boards from said holding fixture.

2. A method for holding and trimming PC boards as in claim 1 which includes the further step of providing and mounting on the X and Y motion mechanism linear ball bushings that mate and ride along compatibly formed and provided hardened steel shafts.

3. A method for holding and trimming PC boards as in claim 1 which includes providing in the safety control circuit two hand grips spaced conventionally apart so that a two-handed operation is required and with a push button switch associated with each hand grip and each of said button switches required to be actuated before motor rotation is achieved.

4. A method for holding and trimming PC boards as in claim 3 in which the safety control circuit further includes providing a dynamic brake which is actuated to provide a rapid stop of the motor and blade in less than a second.

5. A method for holding and trimming PC boards as in claim 1 which further includes forming and providing the removable holding fixture with a movable side member carried by a linear guide means and means for moving said side member to and from a retaining position of said PC board and clamping the PC board during trimming.

6. A method for holding and trimming PC boards as in claim 5 which further includes providing a cam actuated clamp which is used to move the side member to a retaining and clamping condition.

7. A method for holding and trimming PC boards as in claim 6 which further includes supporting the PC board by three plate members each of which have inwardly and upwardly formed grooves adapted and disposed to engage and support a PC board along three sides of the board and with one of the side members fixed, and an opposite side member movable and secured by the cam actuated clamp.

8. A method for holding and trimming PC boards as in claim 7 which further includes carrying the fixed plate member and the opposed cam actuated plate member by linear guide means and retaining the fixed plate member by screw means and with the movable plate biased into a retaining condition and this bias provides a force means to retain the PC board.

9. A method for holding and trimming PC boards as in claim 1 which further includes providing on each holding fixture outwardly extending fixed ears and securing this fixture to the X and Y motion mechanism by toggle clamps secured to and movable with the X and Y mechanism.

10. A method for holding and trimming PC boards as in claim 1 which further includes forming and providing in the removable holding fixture two outer plate members each with retaining grooves providing shelf supports and a movable plate member with a compatible retaining groove facing toward an outer plate member, this plate member positioned and retained by angle brackets and T-groove means secured to an outer plate member and further including a like angle bracket and T-slot means secured to this movable plate member and opposite this outer plate member is an adjustable length plate member retained in a secured position by bracket means.

11. A method for holding and trimming PC boards as in claim 10 which further includes forming the adjustable length member with two portions and with an overlap providing an interior face that is substantially in a plane and in this interior face of said overlapped plate members and in the movable member is formed retaining grooves compatible with the grooves in the outer plate members.

12. A method for holding and trimming PC boards as in claim 11 which further includes providing a vacuum conduit in one fixed outer plate member and providing in another portion of the side walls of the fixture an aperture that is formed and selectively covered and uncovered by a pivotally secured leaf member to bring the interior of this fixture to a condition of reduced pressure and when the leaf member is moved to uncover said aperture the interior of the fixture is brought to atmospheric pressure.

13. A method for holding and trimming PC boards as in claim 1 which further include providing a plurality of standoffs positioned to locally engage and support the PC board at locations other than where a mounted electrical component is secured to the PC board.

14. A method for holding and trimming PC boards as in claim 1 which further provide the holding fixture with four fixed plate side walls and in one plate side wall providing a vacuum conduit for bringing the interior of the fixture to a condition of negative pressure and in a plate side wall providing an aperture which is covered and uncovered by a pivotally secured leaf member and connecting a source of vacuum to the interior of the fixture to bring said fixture to a condition of reduced pressure and when the pivotable leaf member is moved to uncover the aperture the interior of the fixture is brought to atmospheric pressure, mounting on the top of the fixture a plate member into which receiving recesses are formed for one or more PC boards which may be of irregular configuration and mounting and retaining said top plate on the four plate side walls by positioning pin means.

15. An apparatus and fixture for holding at least one PC board prior to and during trimming of an upper surface of said board, said apparatus and fixture including:
(a) a base including a support plate;
(b) an X and Y motion mechanism movable in a prescribed plane and carried by and above said base, said mechanism movable by operator manipulation and with minimal friction and effort;
(c) a motor and cutting blade rotatable by said motor at a selected speed and with the cutting edge of the blade in a plane substantially parallel to and above the prescribed plane of the X and Y motion mechanism;
(d) a carrier mounted on said X and Y motion mechanism and movable with said mechanism in the X and Y directions to and within determined limits by operator manipulation and including a safety control circuit insuring that trimming occurs only when and while the operator moves the motion mechanism in a foolproof and safe manner, and
(e) a holding fixture removably mounted on said carrier, said fixture having at least three side holding plates and with said plates providing means for retaining and positioning the upper surface of said PC board or boards toward the cutting blade so that said upper face is in a plane substantially parallel to the cutting plane of the blade and with said holding fixture having means for ready retention and release of successive PC boards.

16. An apparatus and fixture for holding and trimming PC boards as in claim 15 in which the X and Y motion mechanism includes linear ball bushings and compatibly formed and provided hardened steel shafts.

17. An apparatus and fixture for holding and trimming PC boards as in claim 16 in which the base that carries the X and Y motion mechanism also carries side members which provide a fixed support for the motor and cutting blade and also a support for indicating means for the selected speed of the motor.

18. An apparatus and fixture for holding and trimming PC boards as in claim 17 in which the motor is housed with a safety emergency blade stop carried adjacent to and above the rotating blade.

19. An apparatus and fixture for holding and trimming PC boards as in claim 15 in which the safety control circuit includes two hand grips spaced conventionally apart so that a two-handed operation is required and with a push button switch associated with each hand grip and each of said button switches required to be actuated before motor rotation is achieved.

20. An apparatus and fixture for holding and trimming PC boards as in claim 19 in which the safety control circuit includes a dynamic brake which is actuated to provide a rapid stop of the motor and blade in less than a second.

21. An apparatus and fixture for holding and trimming PC boards as in claim 20 in which each hand grip is carried on an upstanding leg of a tubular arm secured to the X and Y motion mechanism.

22. An apparatus and fixture for holding and trimming PC boards as in claim 15 in which the removable holding fixture is for a PC board that is sufficiently thick or stiff to not be warped or bowed prior to or during trimming the fixture for holding said PC board including a movable side member carried by a linear guide means and means for moving said side member to and from a retaining position of said PC board and clamping the PC board during trimming.

23. An apparatus and fixture for holding and trimming PC boards as in claim 22 in which the moving of the side member to a retaining and clamping condition includes a cam actuated clamp.

24. An apparatus and fixture for holding and trimming PC boards as in claim 23 in which the holding fixture includes three plate members each of which have inwardly and upwardly formed grooves adapted and disposed to engage and support a PC board along three sides of the board and with one of the side members fixed, and an opposite side member movable and secured by the cam actuated clamp.

25. An apparatus and fixture for holding and trimming PC boards as in claim 24 in which the fixed plate member is carried by the linear guide means and is secured in position by screw means and the cam actuated plate member is biased into retaining condition and this bias provides a force means to retain the PC board.

26. An apparatus and fixture for holding and trimming PC boards as in claim 25 in which the bias is provided by two compression springs and with a spring carried on said linear guide means.

27. An apparatus and fixture for holding and trimming PC boards as in claim 26 in which the linear guide means includes two metal rods and bearings slidable thereon.

28. An apparatus and fixture for holding and trimming PC boards as in claim 27 in which the rods of linear guide means are carried in side members that are of a lesser height that the plate member providing the stop shoulder for a rear edge of the PC board.

29. An apparatus and fixture for holding and trimming PC boards as in claim 28 in which the bearings are secured in housing retainers that are mounted in side members that are carried by the linear guide means.

30. An apparatus and fixture for holding and trimming PC boards as in claim 15 in which the holding fixture is removably secured to the X and Y motion mechanism by ear portions secured to the fixture and with said ear portions adapted to be engaged by toggle clamps secured to and movable with the X and Y mechanism.

31. An apparatus and fixture for holding and trimming PC boards as in claim 15 in which the removable holding fixture for a PC board includes two outer plate members each with retaining grooves providing shelf supports and a movable plate member with a compatible retaining groove facing toward an outer plate member, the movable plate member positioned and retained by angle brackets and T-slot means secured to an outer plate member and further including a like angle bracket and T-slot means secured to this movable plate member and opposite this outer plate member is an adjustable length plate member retained in a secured position by bracket means.

32. An apparatus and fixture for holding and trimming PC boards as in claim 31 in which the adjustable length member is made with an overlap adapted to provide an interior face that is substantially in a plane and in this interior face of said overlapped plate members and in the movable member is formed retaining grooves compatible with the grooves in the outer plate members.

33. An apparatus and fixture for holding and trimming PC boards as in claim 32 in which the adjustable length member is additionally held together by thumb screw means and each angle bracket is fixedly secured to a plate member and at substantially right angles thereto is a T-nut secured in a mating slot in a T-groove member and this T-nut is releasably secured by a mating tightening means.

34. An apparatus and fixture for holding and trimming PC boards as in claim 32 in which a vacuum conduit is provided in one fixed outer plate member and in the movable plate is formed an aperture that is selectively covered and uncovered by a pivotally secured leaf member to bring the interior of this fixture to a condition of reduced pressure and when the leaf member is moved to uncover said aperture the interior of the fixture is brought to atmospheric pressure.

35. An apparatus and fixture for holding and trimming PC boards as in claim 32 in which there are provided a plurality of standoffs adapted to locally engage and support the PC board at locations other than where a mounted electrical component is secured to the PC board.

36. An apparatus and fixture for holding and trimming PC boards as in claim 35 in which the fixture is provided with a sliding seal means to close each T-slot so as to reduce leaks of vacuum applied to the fixture.

37. An apparatus and fixture for holding and trimming PC boards as in claim 15 in which said holding fixture is made with four fixed plate side walls and in one plate side wall is provided a vacuum conduit for bringing the interior of the fixture to a condition of negative pressure and in a plate side wall there is provided an aperture which is covered and uncovered by a pivotally secured leaf member and with a connected source of vacuum the interior of the fixture is brought to a condition of reduced pressure and when the pivotable leaf member is moved to uncover the aperture the interior of the fixture is brought to atmospheric pressure, and the top of the fixture includes a plate member into which receiving recesses are formed for one or more PC boards which may be of irregular configuration, said top plate retained on the four plate side walls by positioning pin means.

38. An apparatus and fixture for holding and trimming PC boards as in claim 37 in which there is additionally provided an inner plate that is removably placed within the fixture and on this plate is secured a plurality of standoffs adapted and positioned to engage and support the PC board or boards at locations other than where a mounted electrical component is secured to the board.

39. An apparatus and fixture for holding and trimming PC boards as in claim 15 in which the grooves in the removable fixture mounted to the X and Y motion mechanism are formed with an undercut to provide a hold down action.

40. An apparatus and fixture for holding and trimming PC boards as in claim 39 in which the hold down grooves are formed with sloped side walls providing an included angle of less than ninety degrees.

* * * * *